United States Patent
Liu et al.

(10) Patent No.: US 9,741,921 B2
(45) Date of Patent: Aug. 22, 2017

(54) HYDROGEN FREE AMORPHOUS SILICON AS INSULATING DIELECTRIC MATERIAL FOR SUPERCONDUCTING QUANTUM BITS

(71) Applicant: The Government of the United States of America, as represented by the Secretary of the Navy, Washington, DC (US)

(72) Inventors: Xiao Liu, Fairfax, VA (US); Daniel R. Queen, Silver Spring, MD (US); Frances Hellman, Berkeley, CA (US); Thomas H. Metcalf, Washington, DC (US); Matthew R. Abernathy, Washington, DC (US); Glenn G. Jernigan, Waldorf, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 15/352,639

(22) Filed: Nov. 16, 2016

(65) Prior Publication Data
US 2017/0069819 A1    Mar. 9, 2017

Related U.S. Application Data

(63) Continuation-in-part of application No. 14/538,968, filed on Nov. 12, 2014, now Pat. No. 9,530,535.
(Continued)

(51) Int. Cl.
*H01L 39/24* (2006.01)
*H01L 39/02* (2006.01)
(Continued)

(52) U.S. Cl.
CPC ............ *H01L 39/2493* (2013.01); *C21D 1/40* (2013.01); *C21D 1/773* (2013.01); *C22C 45/00* (2013.01);
(Continued)

(58) Field of Classification Search
CPC combination set(s) only.
See application file for complete search history.

(56) References Cited

U.S. PATENT DOCUMENTS 6,080,643 A     6/2000  Noguchi
6,436,739 B1 *  8/2002  Wickboldt .............. C23C 14/10
                                                  438/149
(Continued)

OTHER PUBLICATIONS

M. Steffan, "Superconducting Qubits Are Getting Serious," Physics 4, 103 (2011).
(Continued)

*Primary Examiner* — Mamadou Diallo
(74) *Attorney, Agent, or Firm* — US Naval Research Laboratory; Joslyn Barritt

(57) ABSTRACT

A hydrogen-free amorphous dielectric insulating film having a high material density and a low density of tunneling states. The film is prepared by deposition of a dielectric material on a substrate having a high substrate temperature $T_{sub}$ under high vacuum and at a controlled low deposition rate. In one embodiment, the film is amorphous silicon while in another embodiment the film is amorphous germanium.

6 Claims, 9 Drawing Sheets

Related U.S. Application Data

(60) Provisional application No. 61/903,521, filed on Nov. 13, 2013.

(51) Int. Cl.

| | | |
|---|---|---|
| *C21D 1/773* | (2006.01) | |
| *C23C 14/06* | (2006.01) | |
| *C21D 1/40* | (2006.01) | |
| *C23C 14/14* | (2006.01) | |
| *C23C 14/54* | (2006.01) | |
| *C22C 45/00* | (2006.01) | |
| *H01B 19/04* | (2006.01) | |
| *H01B 3/02* | (2006.01) | |
| *H01L 21/02* | (2006.01) | |

(52) U.S. Cl.
CPC .......... *C23C 14/06* (2013.01); *C23C 14/0605* (2013.01); *C23C 14/0652* (2013.01); *C23C 14/14* (2013.01); *C23C 14/541* (2013.01); *H01B 3/02* (2013.01); *H01B 19/04* (2013.01); *H01L 21/02112* (2013.01); *H01L 21/02123* (2013.01); *H01L 39/02* (2013.01); *H01L 39/025* (2013.01); *H01L 39/24* (2013.01); *C21D 2201/03* (2013.01)

(56) References Cited

U.S. PATENT DOCUMENTS

| 6,730,368 | B1 | 5/2004 | Kawamura |
| 6,893,984 | B2 | 5/2005 | Ahn et al. |
| 2002/0171122 | A1 | 11/2002 | Voutsas |
| 2006/0170058 | A1 | 8/2006 | Chiang et al. |

OTHER PUBLICATIONS

J.M. Martinis, K.B. Cooper, R. McDermott, M. Steffen, M. Ansmann, K.D. Osborn, K. Cicak, S. Oh, D.P. Pappas, R.W. Simmonds, and C. C. Yu, "Decoherence in Josephson Qubits from Dielectric Loss," Phys. Rev. Lett., 95, 210503 (2005).

R.O. Pohl, X. Liu, and E.J. Thompson, "Low temperature thermal conductivity and acoustic attenuation in amorphous solids," Rev. of Mod. Phys. 74, 991 (2002).

X. Liu, B.E. White, Jr., R.O. Pohl, E. Iwanizeko, K.M. Jones, A.H. Mahan, B.N. Nelson, R.S. Crandall, and S. Veprek, "Amorphous solid without low energy excitations," Phys. Rev. Lett. 78, 4418 (1997).

X. Liu and R.O. Pohl, "Low-energy excitations in amorphous films of silicon and germanium", Phys. Rev. B 58, 9067 (1998) ("Liu 1998").

X. Liu, D. Queen, T.H. Metcalf, J.E. Karel, and F. Hellman, "Hydrogen free amorphous silicon with no tunneling states," Phys. Rev. Lett. 113, 025503 (2014).

D.R. Queen, X. Liu, J. Karel, T.H. Metcalf, and F. Hellman, "Excess specific heat in evaporated amorphous silicon," Phys. Rev. Lett., 110, 135901 (2013).

H. Paik and K.D. Osborn, "Reducing quantum-regime dielectric loss of silicon nitride for superconducting quantum circuits," Appl. Phys. Lett., 96, 072505 (2010).

H. Paik, D.I. Schuster, L. S. Bishop, G. Kirchmair, G. Catelani, A.P. Sears, B.R. Johnson, M.J. Reagor, L. Frunzio, L.I. Glazman, S.M. Girvin, M.H. Devoret, and R.J. Schoelkop, "Observation of High Coherence in Josephson Junction Qubits Measured in a Three-Dimensional Circuit QED Architecture," Phys. Rev. Lett. 107, 240501 (2011).

S.J. Weber, K.W. Murch, D.H. Slichter, R. Vijay, and I. Siddiqi, "Single crystal silicon capacitors with low microwave loss in the single photon regime," Appl. Phys. Lett. 98, 172510 (2011).

W.A. Phillips, "Two-level states in glasses," Rep. Prog. Phys. 50, 1657 (1987.

S. Rau, C. Enss, S. Hunklinger, P. Neu, and A. Würger, "Acoustic properties of oxide glasses at low temperatures," Phys. Rev. B 52, 7179-7194 (1995).

J.E. Graebner and L.C. Allen, "Thermal conductivity of amorphous germanium at low temperatures," Phys. Rev. B 29, 5626-5633 (1984).

D.R. Queen, X. Liu, J. Karel, H.C. Jacks, T.H. Metcalf, and F. Hellman, "Two-level systems in evaporated amorphous silicon," Journal of Non-Crystalline Solids 426 (2015) 19-24.

* cited by examiner

HYDROGEN FREE AMORPHOUS SILICON AS INSULATING DIELECTRIC MATERIAL FOR SUPERCONDUCTING QUANTUM BITS

CROSS-REFERENCE

This application is a Continuation-in-Part of, and claims the benefit of priority under 35 U.S.C. §120 based on U.S. patent application Ser. No. 14/538,968 filed on Nov. 12, 2014, which is a Nonprovisional of, and claims the benefit of priority under 35 U.S.C. §119 based on, U.S. Provisional Patent Application No. 61/903,521 filed on Nov. 13, 2013. The prior applications and all references cited herein are hereby incorporated by reference into the present application.

TECHNICAL FIELD

The present invention relates to amorphous thin film materials such as amorphous silicon (a-Si), amorphous germanium (a-Ge), amorphous carbon (a-C) that are free from two-level tunneling systems (TLS) and are suitable for use as an insulating dielectric material for supercomputing quantum bits.

BACKGROUND

Quantum computing has been a rapidly developing research field in the past two decades. At the heart of quantum computing is the quantum bit, or qubit. The qubit is a unit of quantum information, the quantum analogue of the classical bit in our current computer systems. Qubits in a quantum computer must be able to retain the quantum information they are given long enough to perform quantum logic operations with them.

In principle, any two-level quantum system can be used as a qubit. A wide range of candidate quantum systems have been studied for their possible implementation in practical quantum computer as qubits. They can be photons, electrons or nuclear spins, trapped atoms or ions, defect quantum states in solids, superconducting circuits (Josephson junctions), etc.

Superconducting circuits with Josephson junction are solid state devices fabricated by modern integrated circuits techniques, and are manipulated and measured by well-developed low frequency electronics and microwave techniques. A Josephson junction is formed by connecting two superconducting electrodes separated by a dielectric insulating layer. A group of qubits that are based on superconducting circuits involves nanofabricated superconducting electrodes coupled through Josephson junctions. Such systems are one of the most promising systems for being fully electronic and easily scalable for large arrays of qubits. See M. Steffan, "Superconducting Qubits Are Getting Serious," *Physics* 4, 103 (2011).

There are many different ways to build a qubit, each having its own pros and cons. Superconducting circuits with Josephson junctions have emerged as a promising technology for quantum information processing with solid-state devices for its scalability, in which superconductor is assembled macroscopically to form qubits. Since such qubits involve the collective motion of a large number ($\sim 10^{10}$) of Cooper-pair electrons, the coherence time is typically very short. Progress has been made to increase the coherence time from 1 ns in 1999 to 60 µs in 2011. See Steffan, supra. It is now understood that dielectric loss from two-level states in the dielectric insulating layer is the dominant decoherence source in superconducting qubits. See J. M. Martinis, K. B. Cooper, R. McDermott, Matthias Steffen, M. Ansmann, K. D. Osborn, K. Cicak, S. Oh, D. P. Pappas, R. W. Simmonds, and C. C. Yu, "Decoherence in Josephson Qubits from Dielectric Loss," *Phys. Rev. Lett.*, 95, 210503 (2005). The solution will be either to reduce TLS in dielectric layer or to minimize their impact by other means.

Currently, the main issue that limits the performance of superconducting qubits is the decoherence caused by spurious coupling of qubits to microscopic defect states in the materials used to implement the circuits. Dielectric loss from the two-level tunneling systems (TLS) in the amorphous dielectric thin films used as insulating layers is the dominant source of decoherence. See Martinis, supra. TLS universally exist in almost all kinds of amorphous solids and a large number of disordered crystalline solids. R. O. Pohl, X. Liu, and E. J. Thompson, "Low temperature thermal conductivity and acoustic attenuation in amorphous solids," *Rev. of Mod. Phys.* 74, 991 (2002). A special type of hydrogenated amorphous silicon prepared by hot-wire chemical vapor deposition was found to contain almost no TLS. See X. Liu, B. E. White, Jr., R. O. Pohl, E. Iwanizcko, K. M. Jones, A. H. Mahan, B. N. Nelson, R. S. Crandall, and S. Veprek, "Amorphous solid without low energy excitations," *Phys. Rev. Lett.* 78, 4418 (1997) ("Liu 1997"). However, this material is difficult to prepare and the TLS content is hard to control in a reproducible way. X. Liu and R. O. Pohl, "Low-energy excitations in amorphous films of silicon and germanium", *Phys. Rev. B* 58, 9067 (1998) ("Liu 1998").

Efforts have been made to reduce the density of TLS. Hydrogenated silicon nitride has been used to replace silicon dioxide as dielectric layer and dielectric loss is reduced by a factor of 50. See H. Paik and K. D. Osborn, "Reducing quantum-regime dielectric loss of silicon nitride for superconducting quantum circuits," *Appl. Phys. Lett.*, 96, 072505 (2010). Efforts have also been made to make overall device size larger while keeping the dielectric layer thickness as small as possible to reduce the relative impact. See H. Paik, D. I. Schuster, L. S. Bishop, G. Kirchmair, G. Catelani, A. P. Sears, B. R. Johnson, M. J. Reagor, L. Frunzio, L. I. Glazman, S. M. Girvin, M. H. Devoret, and R. J. Schoelkop, "Observation of High Coherence in Josephson Junction Qubits Measured in a Three-Dimensional Circuit QED Architecture," *Phys. Rev. Lett.* 107, 240501 (2011). This has achieved the record long coherence time of 60 µs. Of course, using completely crystalline silicon as dielectric layer has also being pursued with limited success as surface defect states become the main source of dielectric loss. See S. J. Weber, K. W. Murch, D. H. Slichter, R. Vijay, and I. Siddiqi, "Single crystal silicon capacitors with low microwave loss in the single photon regime," *Appl. Phys. Lett.* 98, 172510 (2011).

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides hydrogen-free amorphous dielectric insulating thin films having a low density of tunneling states and a process for making the same. The amorphous material comprising the films have a high mass density, typically at least 90% of the density of its crystalline counterpart.

In an exemplary embodiment, a film in accordance with the present invention is an amorphous silicon film having a density greater than about 2.18 g/cm$^3$ and a hydrogen content of less than about 0.1%, prepared by electron beam (e-beam) deposition at a controlled rate of about 0.1 nm/sec on a substrate having $T_{sub}$=400° C. under a vacuum pressure of 1×10$^{-8}$ Torr. The film is prepared by deposition of a dielectric material on a substrate having a high substrate temperature $T_{sub}$ just below the temperature at which the material exhibits crystalline states, the deposition being in a high vacuum (low pressure) environment, e.g., about 1×10$^{-7}$ to about 1×10$^{-11}$ Torr, and at a controlled low deposition rate, e.g., less than about 0.1 nm/sec.

In another exemplary embodiment, a film in accordance with the present invention is an amorphous germanium (a-Ge) film having a thickness of about 330 nm and a hydrogen content of less than about 0.1%.

In accordance with the present invention, such an amorphous germanium film can be prepared by e-beam deposition from a high-purity (99.9999% pure) Ge source on a substrate having a substrate temperature $T_{sub}$ of from room temperature to about 200° C. at a controlled growth rate of about 0.03 to about 0.05 nm/sec. Deposition is made in an ultra-high vacuum (UHV) environment with a base pressure of about 5×10$^{-11}$ Torr, with the pressure during film growth typically being at about at 5×10$^{-9}$ Torr.

DETAILED DESCRIPTION

Figure 1:
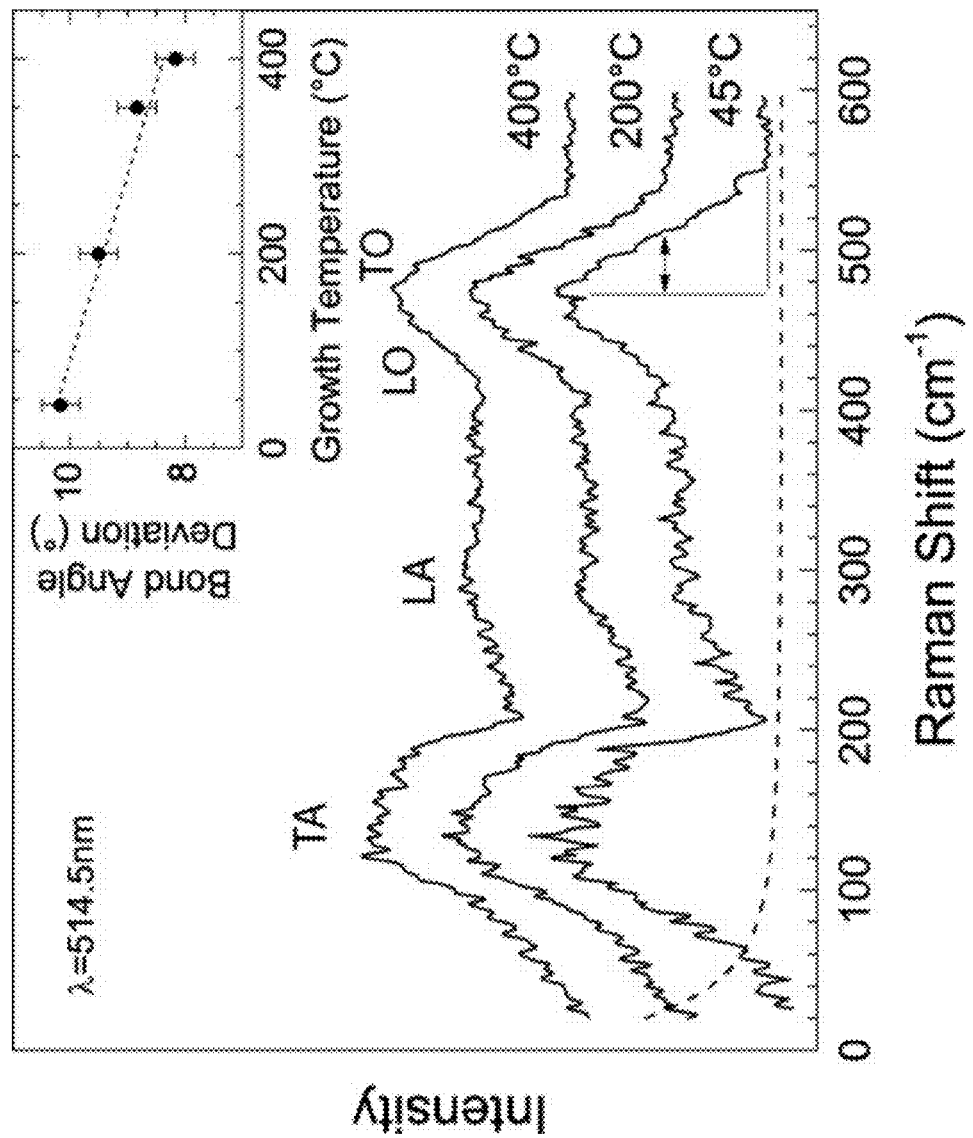
FIG. 1 are plots depicting Raman spectra of e-beam a-Si films deposited at different growth temperatures.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

All references cited herein are incorporated into the present disclosure in their entirety.

As noted above, it is desirable to obtain a high-quality insulating dielectric material that is free from TLS for use with superconducting quantum bits. Such a TLS-free material can be used as the insulating dielectric layer to separate the two superconducting layers in a Josephson junction without producing undesirable dielectric losses and decoherence in the supercomputing qubits.

It has previously been thought that hydrogen incorporation in amorphous silicon was important to eliminate TLS. However, in practice, it is hard to control the right amount of hydrogen, and the presence of hydrogen can often do more harm than good in such a material. The inventors of the present invention have demonstrated that increasing mass density reduces TLS density in several different amorphous solids, and that hydrogen is not a necessary ingredient to reduce TLS in amorphous solids. See D. R. Queen, X. Liu, J. Karel, H. C. Jacks, T. H. Metcalf, and F. Hellman, "Two-level systems in evaporated amorphous silicon," J. Non-Cryst. Solids, 426, 19-24 (2015). The inventors of the present invention have also recently discovered that amorphous silicon (a-Si) thin films produced by electron beam (e-beam) evaporation on substrates having a high substrate temperature $T_{sub}$ are high density films that contain no TLS. See X. Liu, D. Queen, T. H. Metcalf, J. E. Karel, and F. Hellman, "Hydrogen free amorphous silicon with no tunneling states," Phys. Rev. Lett. 113, 025503 (2014) ("Liu 2014"); and D. R. Queen, X. Liu, J. Karel, T. H. Metcalf, and F. Hellman, "Excess specific heat in evaporated amorphous silicon," Phys. Rev. Lett., 110, 135901 (2013).

Thus, the present invention includes high-density hydrogen-free amorphous dielectric insulating thin films that are substantially free from two-level tunneling systems (TLS) and a process for forming the same. The amorphous material comprising the films have a high mass density close to that of its crystalline counterpart, typically having a density of at least 90% of the density of its crystalline counterpart. For example, a-Si prepared in accordance with the process of the present invention has a mass density of about 2.18 g/cm$^3$, compared to a mass density of about 2.329 g/cm$^3$ for Si in its crystalline form.

Such material is a perfect candidate for use as a dielectric insulating layer in superconducting qubits. Specific heat measurements of a-Si made by the inventors show that the density of TLS is reduced by a factor of 100 as the substrate temperature $T_{sub}$ increases from 45° C. to 400° C. In addition, the inventors found that the elastic loss, or internal friction, of this a-Si material is about three orders of magnitude smaller than that of a typical amorphous thin film.

In an exemplary embodiment, the TLS-free insulating dielectric thin films provided by the present invention are in the form of a-Si thin films having a mass density greater than about 2.18 g/cm$^3$ and a hydrogen content of less than about 0.1%. In other embodiments, the TLS-free insulating dielectric thin films in accordance with the present invention can include high-density amorphous germanium (a-Ge) or amorphous carbon (a-C), while in still other embodiments, the thin film may be a compound or alloy film formed from at least two elements, for example, from two or more of silicon (Si), germanium (Ge), carbon (C), nitrogen (N), phosphorus (P), arsenic (As), boron (B), aluminum (Al), gallium (Ga), or oxygen (O).

Irrespective of the materials used, because the amorphous dielectric insulating thin films according to the present invention do not contain two-level tunneling systems, they are particularly well-suited for superconducting qubits, Josephson junctions, and other devices where noise from two-level systems degrades performance.

Such high-density TLS-free amorphous dielectric insulating thin films are obtained by depositing an insulating dielectric material on a substrate having a high substrate temperature $T_{sub}$ just below a temperature at which the material will begin to exhibit crystalline states. Deposition will often be by electron beam (e-beam) evaporation of the material on the substrate, though any other suitable deposition technique such as sputtering, chemical vapor deposition, or pulsed laser deposition may also be used. Deposition will typically start in a high base vacuum (low pressure) environment, e.g., about $1\times10^{-7}$ to about $1\times10^{-11}$ Torr, at a controlled slow deposition rate, e.g., about 0.1 nm/sec.

Thus, in an exemplary embodiment, a process for preparing a TLS-free dielectric insulating thin film in accordance with the present invention includes the steps of depositing Si on a substrate having a substrate temperature $T_{sub}$ of about 350° C. to about 400° C. using e-beam evaporation under a vacuum pressure of about $1\times10^{-8}$ Torr at a rate of about 1 Å (0.1 nm) per second Of course, in other embodiments, other appropriate vacuum pressures and/or deposition rates may be used to produce TLS-free amorphous dielectric insulating thin films from Si or other appropriate materials, and all such other embodiments are deemed to be within the scope of the present invention.

To investigate the properties of exemplary TLS-free amorphous dielectric insulating thin films in accordance with the present invention, the inventors prepared a-Si thin films by e-beam evaporation from a high purity Si source in a UHV system on substrates having a substrate temperature $T_{sub}$ varying from 45° C. to 400° C. with a base pressure of $1\times10^{-8}$ Torr and a growth rate of 0.05-0.1 nm/sec.

Films grown on the substrates at the same time or in identical conditions were examined by Raman spectroscopy and X-ray diffraction, and all films were found to be fully amorphous. The Raman spectra, measured with the 514.5 nm line of an Ar ion laser, of the a-Si films deposited using e-beam deposition at $T_{sub}$=45, 200, and 400° C. are shown in FIG. 1. These spectra show two distinct bands, a first band at 200 $cm^{-1}$ and a second band at about 480 $cm^{-1}$, where the first and second bands are associated with transverse-acoustic (TA) and transverse-optical (TO) vibrational modes, respectively. Also shown in FIG. 1 are the longitudinal-acoustic (LA) and longitudinal-optical (LO) modes between 200 and 420 $cm^{-1}$. As can be seen from the plots in FIG. 1, the TO peak narrows and sharpens with increasing $T_{sub}$, indicating a progressive reduction of the RMS bond angles deviation of a-Si shown in the inset. At the same time, the difference in intensity between the TA and TO peaks decreases, indicating an increase in the intermediate-range order.

The films prepared at $T_{sub}$=45° C. and 400° C. were further examined with cross-sectional transmission electron microscopy (TEM), and the images are shown in FIGS. 2A-2D. No lattice fringes are shown in the high-resolution 5 nm-scale TEM images of either film shown in FIGS. 2A and 2C, confirming that films grown at a high substrate temperature $T_{sub}$ are equally as amorphous as films grown at lower substrate temperature.

Figure 2C:
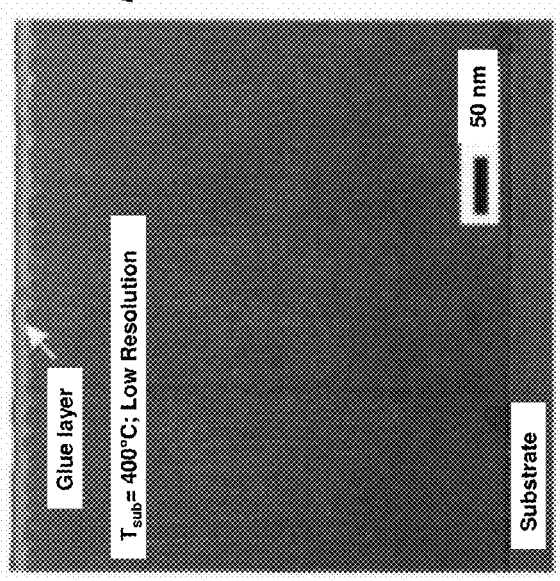
FIGS. 2A-2D are cross-sectional transmission electron microscope (TEM) images of e-beam a-Si films deposited at $T_{sub}$=45° C. and 400° C.
Figure 2D:
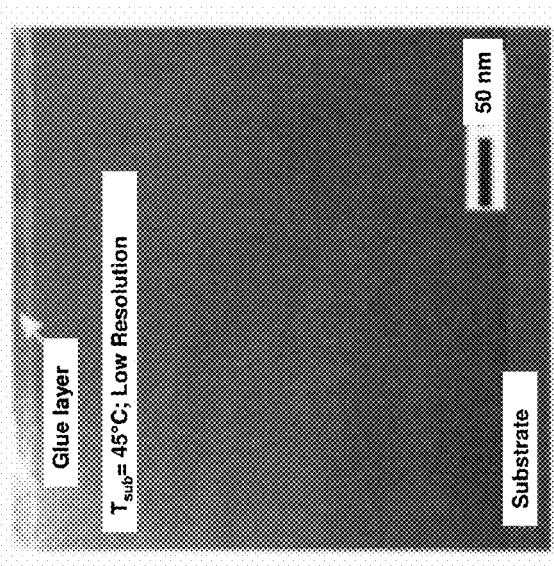
Figure 2A:
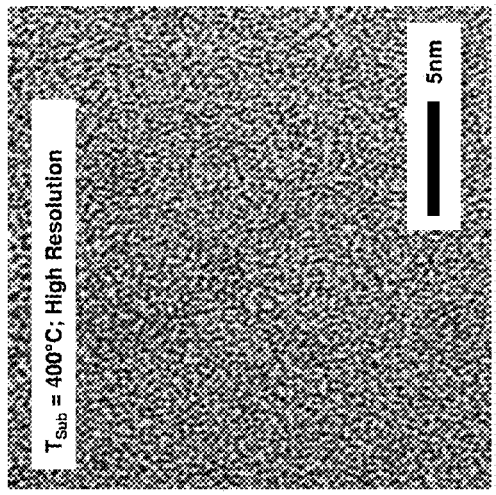
Figure 2B:
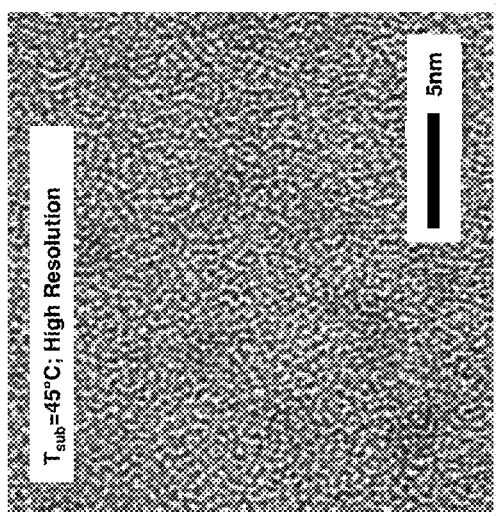

In addition, the low-resolution 50 nm-scale TEM images shown in FIGS. 2B and 2D reveal that both the $T_{sub}$=45° C. and the $T_{sub}$=400° C. films have a columnar growth structure comprising areas of relatively lower and higher density inside the film. However, as can be seen from FIG. 2D, the high-temperature film has a larger column structure and fewer low-density regions, as shown by the relatively "bumpy" top edge of the high-temperature film as compared to the lower temperature one. Rutherford backscattering (RBS) confirmed that the films grown on a high-temperature substrate have a higher density than the lower density ones, showing a density $\rho$=2.02, 2.14, and 2.18 $g/cm^3$ for the a-Si films grown with $T_{sub}$=45, 200, and 350° C., respectively, while the two films grown with $T_{sub}$=400° C. exhibited a density $\rho$=2.17 and 2.22 $g/cm^3$. Oxygen resonance RBS also showed a thin oxide layer (1-2 nm) on all films. The oxygen level decreases with increasing depth, but on average was measured at 4%, 2%, and 0% oxygen in the films deposited at $T_{sub}$=45, 200, and 400° C., respectively. These oxygen profiles are consistent with post-deposition diffusion, whose concentration decreases with increasing substrate temperature as the film gets denser and contains fewer voids.

Figure 3:
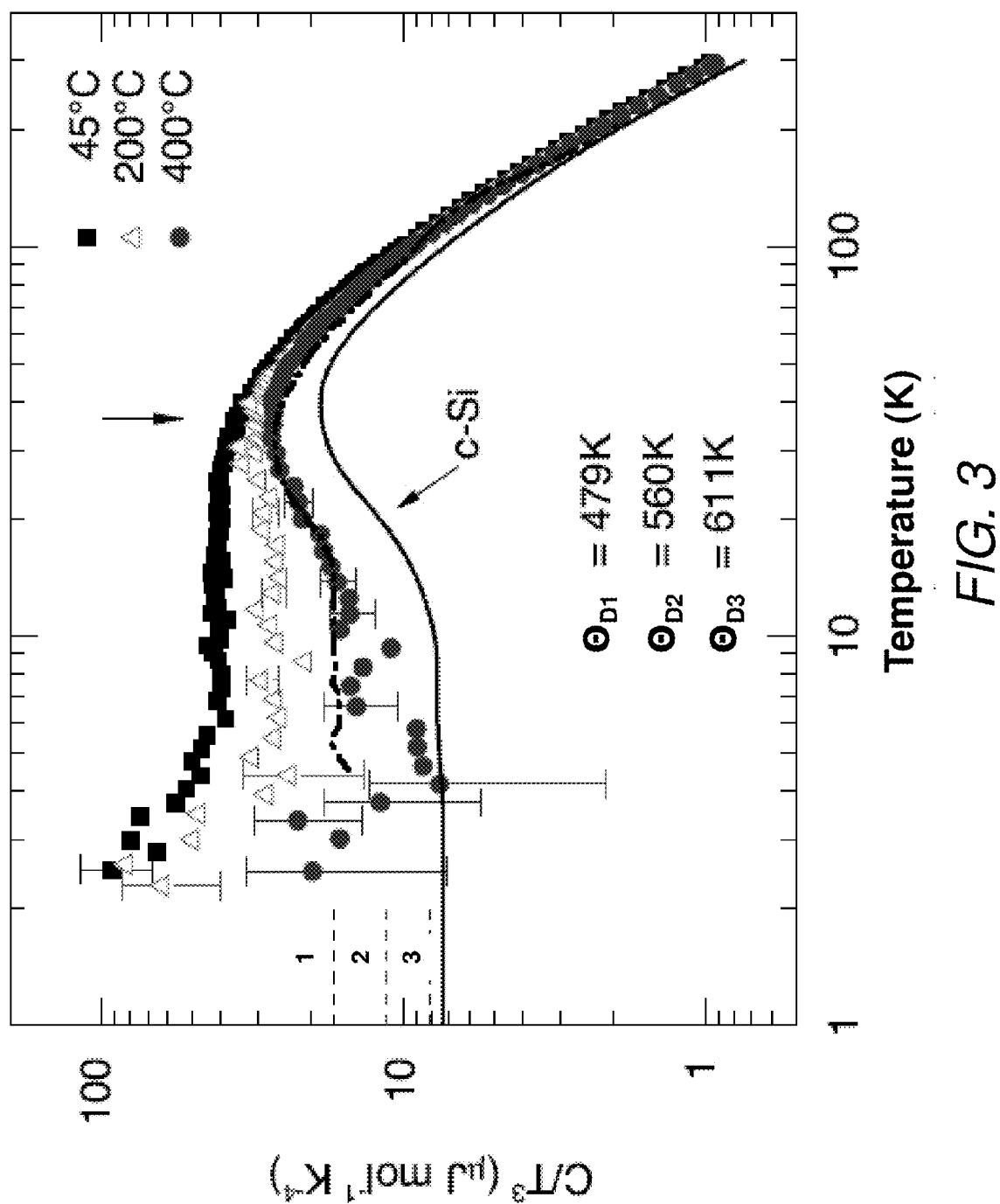
FIG. 3 shows plots of specific heat plotted as C/T$^3$ versus temperature T for e-beam a-Si films prepared at three different substrate temperatures $T_{sub}$.

FIG. 3 reflects the analysis of the specific heat of a-Si films prepared at $T_{sub}$=45, 200° C., and 400° C. in accordance with the present invention.

The specific heat capacity of an amorphous dielectric insulating thin film is dependent on temperature as $C=aT+bT^3$, where T is the temperature, the coefficient "a" is proportional to the density of tunneling states, while the coefficient "b" comes from two different sources. The first source for the coefficient "b" comes from propagating phonons in the material, which is a function of Debye temperature and can be calculated from the elastic properties and mass density of the material. Obviously, the specific heat of all solids, amorphous or not, contain such a $T^3$ proportional term. The second source for the coefficient "b" comes from localized excitations whose origin is not quite understood yet. But it is typical for amorphous solids and it is generally accepted as having the same structural origin as do TLS at lower temperatures. These Debye temperatures are calculated from the speed of sound and mass density measured for each film and are shown in FIG. 3 as "$\theta_{D1}$," "$\theta_{D2}$," and "$\theta_{D3}$," for the films grown at $T_{sub}$=45, 200, and 400° C., respectively. The contribution to the coefficient "b" from propagating phonons for each film can then be calculated and is shown in FIG. 3 as the three horizontal lines labeled 1, 2, and 3 for the films grown at $T_{sub}$=45, 200, and 400° C., respectively.

The values of $C/T^3$ for each of the three amorphous silicon films were plotted, along with $C/T^3$ for crystalline silicon (c-Si shown as the solid line) for reference. When analyzed and plotted as $C/T^3$, the y-axis representing specific heat becomes $a/T^2+b$, such that as T rises, $a/T^2$ decreases while b remains the same, so $C/T^3$ decreases. As T decreases, $a/T^2$ (and $C/T^3$) should increase. However, as can be seen in the plots in FIG. 3, $C/T^3$ for the film prepared at $T_{sub}$=400° C. does not increase with decreasing T as much as it does for the films prepared at lower substrate temperatures, and even exhibits a decrease for temperatures between about 10 and 40 K, remaining statistically unchanged at temperatures below about 10 K. Since the "a" coefficient is proportional to the density of tunneling states, this absence of $a/T^2$ in $C/T^3$ at temperatures below 10 K for the film prepared at $T_{sub}$=400° C. indicates that such film has a lower density of tunneling states than do the films prepared at the higher substrate temperatures.

In addition to the $a/T^2$ term which should increase with lower T, the relatively flat parts of the three curves representing the "b" coefficient shown in FIG. 3 are all higher than their corresponding Debye contributions shown by the horizontal lines labeled 1, 2, and 3 as described above, with the difference coming from the localized excitations related to TLS. It can be seen that the film deposited at $T_{sub}$=400° C. exhibits the smallest difference between the flat parts of the curve and the Debye contribution (horizontal line 3), consistent with such a film having a TLS density lower than that of the other films.

Figure 4:
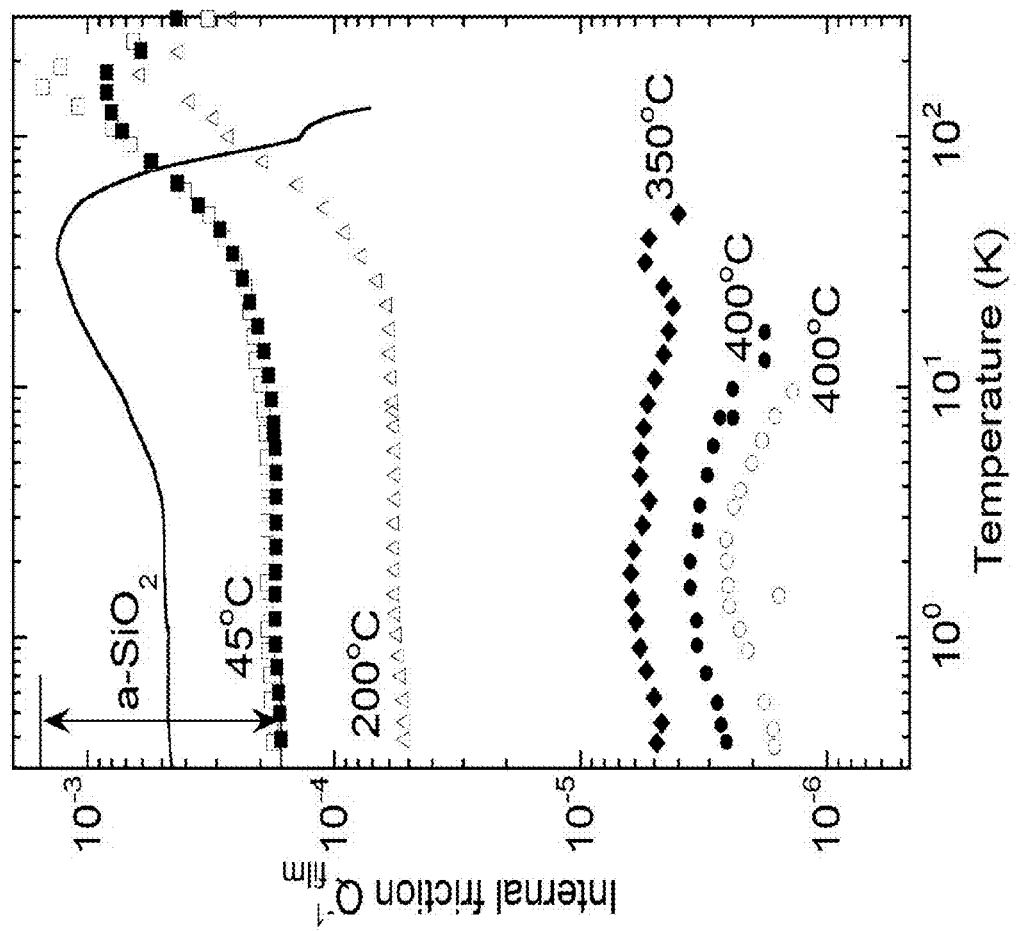
FIG. 4 is a plot of internal friction versus temperature T for e-beam a-Si films prepared at four different substrate temperatures $T_{sub}$.

Plots of the internal friction of ~300 nm-thick a-Si films are shown in FIG. 4. As noted above, TLS exist in almost all amorphous solids, see Pohl et al., supra, and thus far have proved difficult to remove. See Liu 1997 and Liu 1998, supra. TLS cause elastic dissipation at low temperatures and contribute a temperature independent plateau at a few degree Kelvin. The internal friction of a typical amorphous solid (a-SiO$_2$) is shown for reference as a solid line in FIG. 4, while the double arrow represents the range of the internal friction plateau of almost all amorphous solids. This range, known as the "glassy range," has been the bottleneck that limits the coherence time of superconducting qubits.

As can be seen from the plots in FIG. 4, the internal friction of a-Si decreases as the substrate temperature increases. The residual internal friction in both films with $T_{sub}$=400° C. comes from the contamination of our oscillator and is not related to the a-Si films; for a more detailed explanation, see Liu 2014, supra. Thus the minimum internal friction of the a-Si films sets an upper limit on the TLS density and could be lower once the contamination issue can be solved. This is not only a significant scientific breakthrough but also a crucial breakthrough for the quantum computing community.

Figure 5:
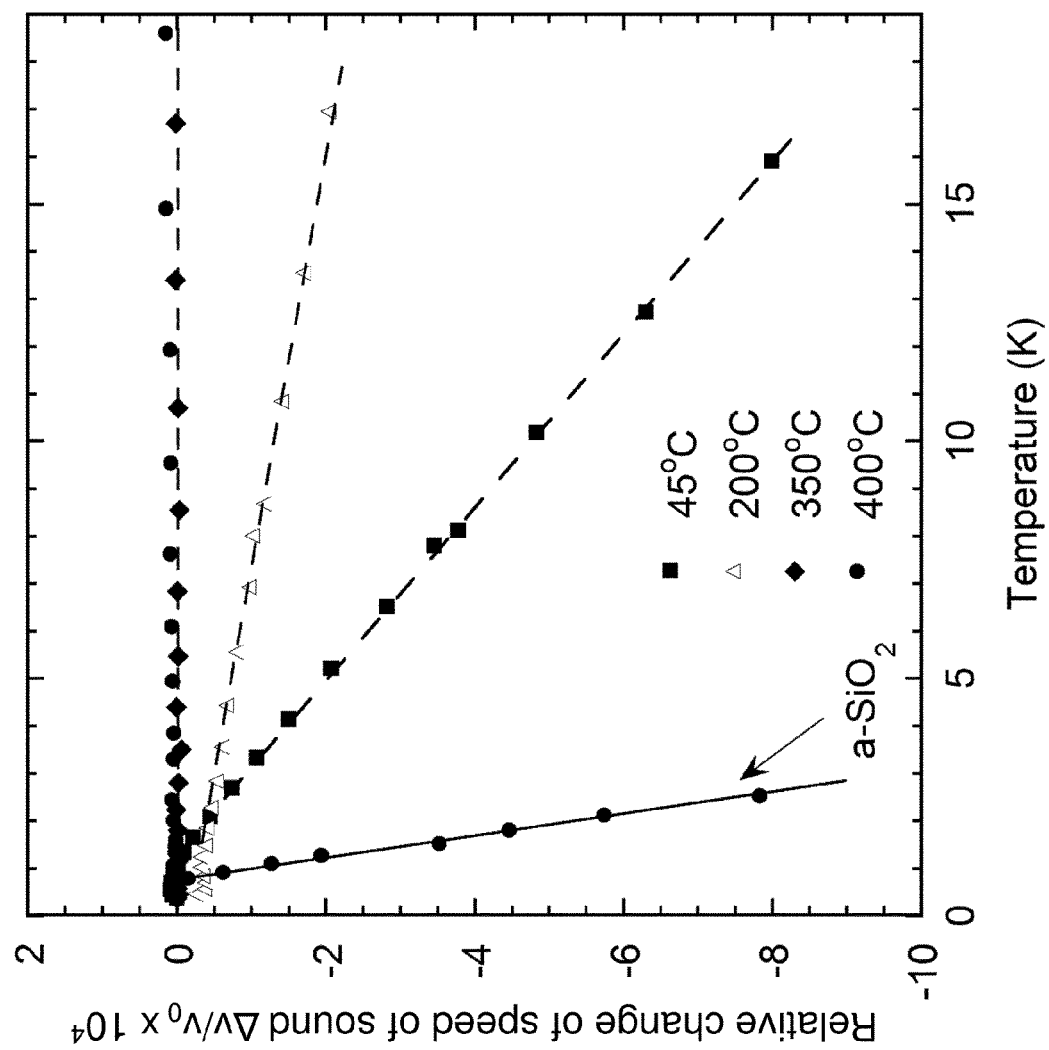
FIG. 5 is a plot of the relative changes of the speed of sound versus temperature T for e-beam a-Si films prepared at four different substrate temperatures $T_{sub}$.

The plots in FIG. 5 show the relative change in the speed of sound of the same films shown in FIG. 4, with the relative change measured at the same time as the internal friction. Accompanied with the internal friction plateau, amorphous solids also show a linear T-dependent relative change of speed of sound with a negative slope β at a few degree Kelvin. β is proportional to the internal friction plateau. This can be understood as the thermally activated relaxation rate dominates the quantum tunneling rate of the same TLS at higher temperatures. See S. Rau, C. Enss, S. Hunklinger, P. Neu, and A. Würger, "Acoustic properties of oxide glasses at low temperatures," *Phys. Rev. B* 52, 7179-7194 (1995). The relative change of speed of sound of a-SiO$_2$ is also shown in FIG. 5 as a reference of a typical amorphous solid. As the substrate temperature of a-Si films increases, β goes to zero.

Figure 6:
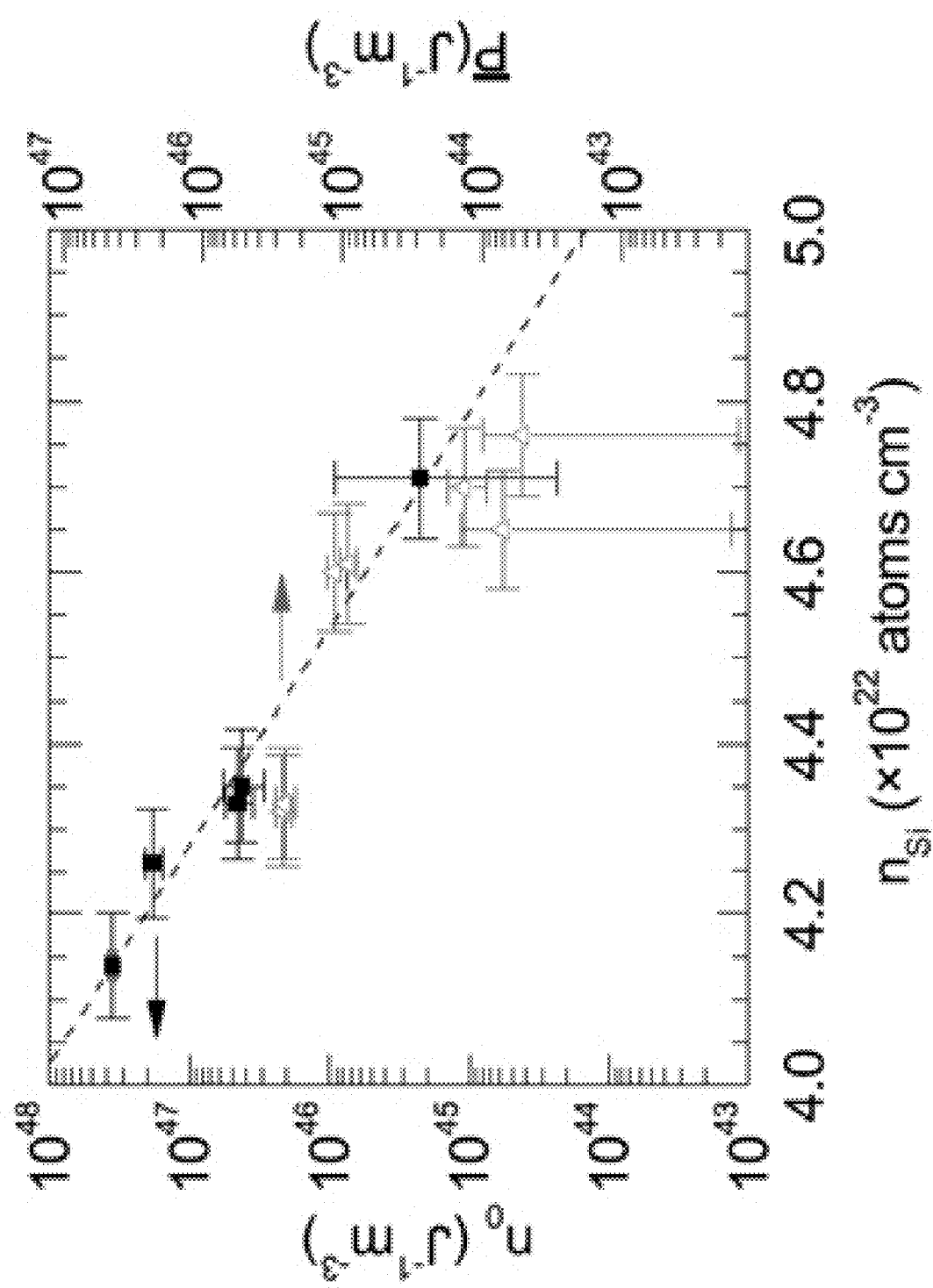
FIG. 6 is a plot showing, the TLS density no versus film density $n_{Si}$, the TLS density no from the film specific heat C, and the spectral TLS density $\bar{P}$ from the film internal friction for e-beam a-Si films prepared at four different substrate temperatures $T_{sub}$.

All of these experiments confirm that a-Si thin films prepared in accordance with the present invention exhibit a near-absence of TLS. In addition, FIG. 6 shows how the TLS density depends on the mass density of the a-Si film. The solid symbols are the density of TLS as measured by specific heat (left y-axis) and the open symbols are the spectral density of TLS as measured by internal friction (right y-axis). The mass density in x-axis is represented by the number of silicon atoms per cubic centimeter. The difference between the density and the spectral density of TLS lies in the different ways, thus proportion of the states, been probed by these two measurement techniques. Thus, growth conditions (i.e. growth temperature) that yield amorphous films with high mass density will also apply to other amorphous dielectric thin films that may be appropriate for use as an insulating layer in superconducting qubits. Techniques such as (but not limited to) sputtering will likely produce high density films also without TLS as well. This result may also be extended to other materials such as amorphous silicon nitride (a-SiN), amorphous germanium (a-Ge), and amorphous carbon (a-C). See J. E. Graebner and L. C. Allen, "Thermal conductivity of amorphous germanium at low temperatures," *Phys. Rev. B* 29, 5626-5633 (1984).

In another exemplary embodiment, the present invention provides a method for forming a hydrogen-free amorphous germanium (a-Ge) thin film having no tunneling states.

In accordance with this embodiment of the present invention, such an amorphous germanium film can be prepared by e-beam deposition from a high-purity (99.9999% pure) Ge source on a substrate having a substrate temperature $T_{sub}$ of from about 7.5° C. to just below 200° C. at a controlled growth rate of about 0.03 to about 0.05 nm/sec. Deposition is made in an ultra-high vacuum (UHV) environment with a base pressure of about 5× 10$^{-11}$ Torr, with the pressure during film growth typically being at about at 5×10$^{-9}$ Torr. An a-Ge thin film produced in accordance with these aspects of the present disclosure can have a thickness of about 330 nm and a hydrogen content of less than about 0.1%.

In other embodiments, the a-Ge film can be deposited on the substrate by, sputtering, chemical vapor deposition, or pulsed laser deposition.

The substrate used for growth of such films is typically made of a high purity silicon wafer having a thickness of about 300 μm. In the exemplary cases illustrated in FIGS. 8 and 9 discussed below, the substrate served as the double-paddle oscillator for the internal friction measurements shown in FIG. 8.

Figure 7:
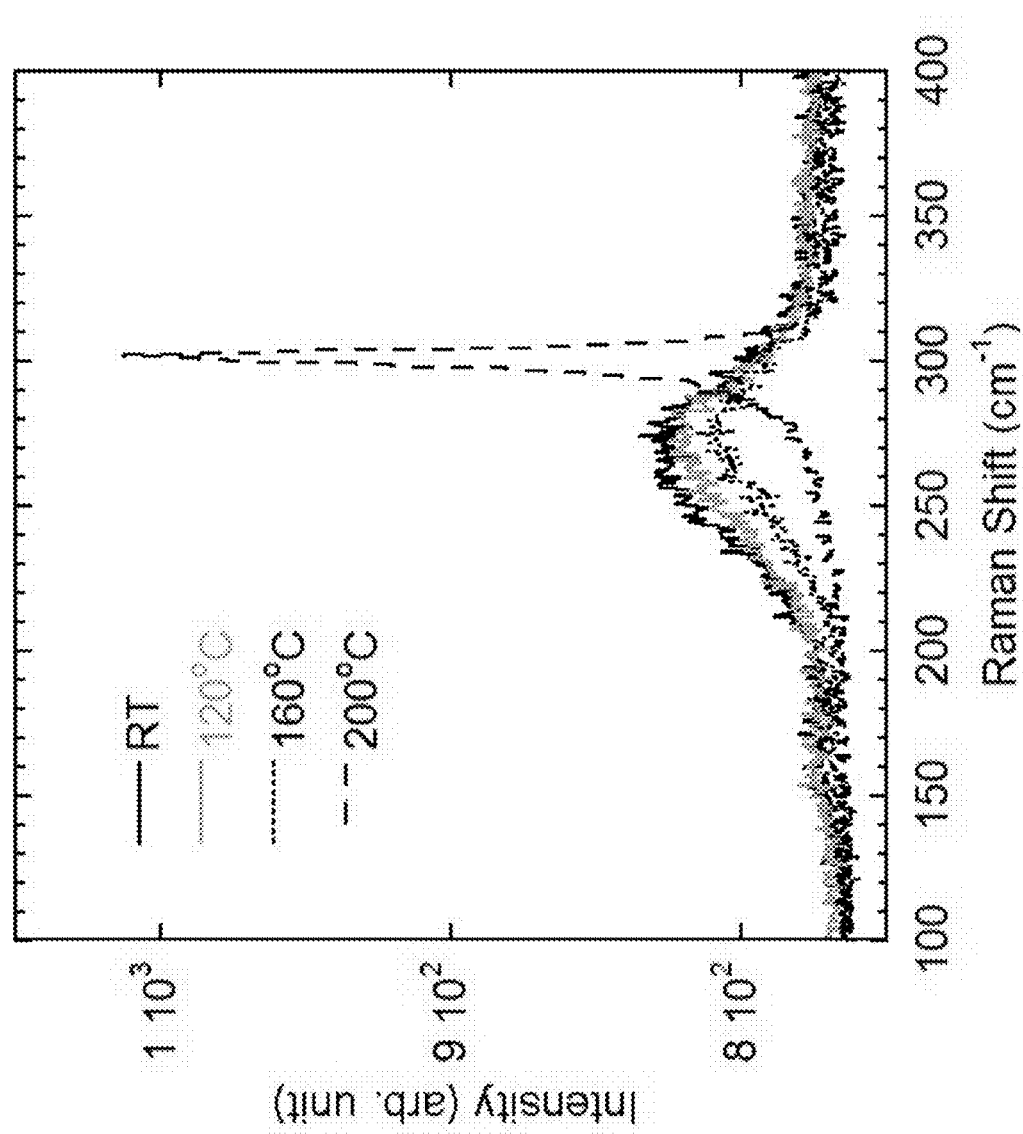
FIG. 7 is a plot showing Raman spectra of thin Ge films prepared at room temperature (RT), 120° C., 160° C., and 200° C.

FIG. 7 shows Raman spectra plots of e-beam a-Ge films deposited under the deposition parameters described above with substrate temperatures $T_{sub}$ of room temperature (RT) and 120, 160 and 200° C. As can be seen from the plots in FIG. 7, only for the film deposited at $T_{sub}$=200° C. is there a characteristic crystalline peak shown at 300 cm$^{-1}$, showing that the film is mostly crystalline. The other films exhibit no such crystalline peak, indicating that such films produced at temperatures below 200° C. are amorphous.

It will be noted here that there may be some uncertainty associated with substrate temperature. For the Ge film illustrated in FIG. 7, the substrate temperature was controlled at 200° C. as controlled by pyrometer which reads directly from the wafer that the substrate was sandwiched in. However, after equilibrium was reached, the substrate temperature showed a reading about 270-280° C. The cause for this discrepancy has not been identified. Consequently it may be possible to conclude that the real substrate temperature was between about 200° C. and 270° C. for the deposition of the Ge film deposited on the nominally 200° C. substrate. In any case, since that film was crystallized as shown by the crystalline peak at 300 cm$^{-1}$, the uncertainty in the substrate temperatures above 200° C. does not affect the conclusion of this work beyond telling us the experimental boundary for depositing fully amorphous germanium films. As can be readily seen from FIG. 7, for films deposited at $T_{sub}$=7.5, 120, and 160° C., the spectra shows a broad maximum at 240 cm$^{-1}$ and no sign of crystalline peak at 300 cm$^{-1}$, indicating the fully amorphous structure of those films.

Figure 8:
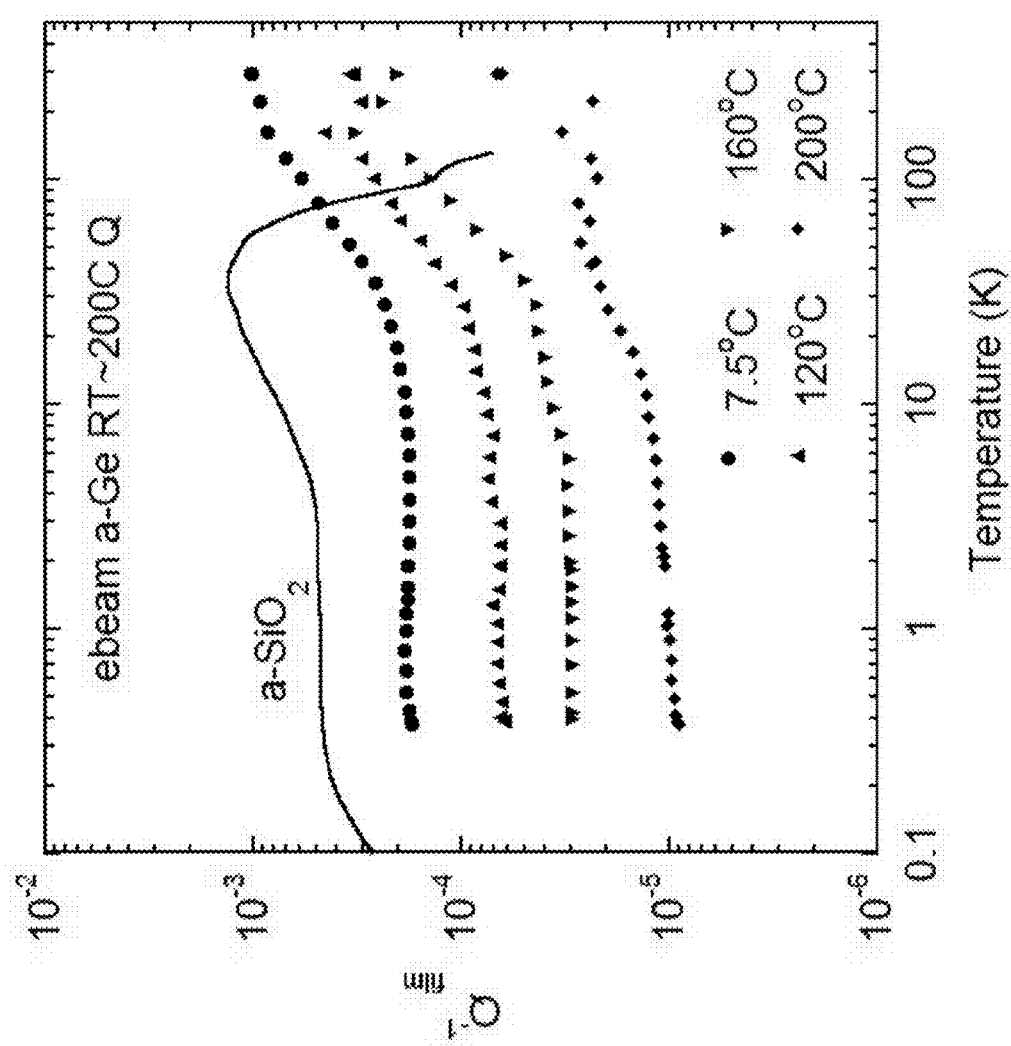
FIG. 8 is a plot showing measurements of internal friction for a typical amorphous solid (a-SiO$_2$) and for thin Ge films prepared at substrate temperatures of 7.5° C., 120° C., 160° C., and 200° C.

FIG. 8 shows plots of the internal friction of the four a-Ge films deposited at $T_{sub}$=7.5, 120, 160, and 200° C. Two-level tunneling states (TLS) cause elastic dissipation at low temperatures and contribute a temperature independent plateau at a few degree Kelvin. The internal friction of a typical amorphous solid (a-SiO$_2$) is shown in FIG. 8 (solid line) as a reference. It represents the typical internal friction plateau one would get from almost all amorphous solids. TLS exist universally in almost all amorphous solids, see Pohl et al., supra, and have thus far proved difficult to remove, see Liu 1997, supra, and Liu 1998, supra, it has been the bottleneck that limits the coherence time of superconducting qubits.

FIG. 8 shows that the internal friction of a-Ge decreases as the substrate temperature increases. The reduction of internal friction is not as much as we found earlier in amorphous silicon. But it definitely demonstrates the same dependence. It is possible that substrate temperature needs a little higher to reduce internal friction further. As deposited germanium film crystallizes at much lower temperature than silicon, it is a little harder to find the optimal deposition temperature.

Figure 9:
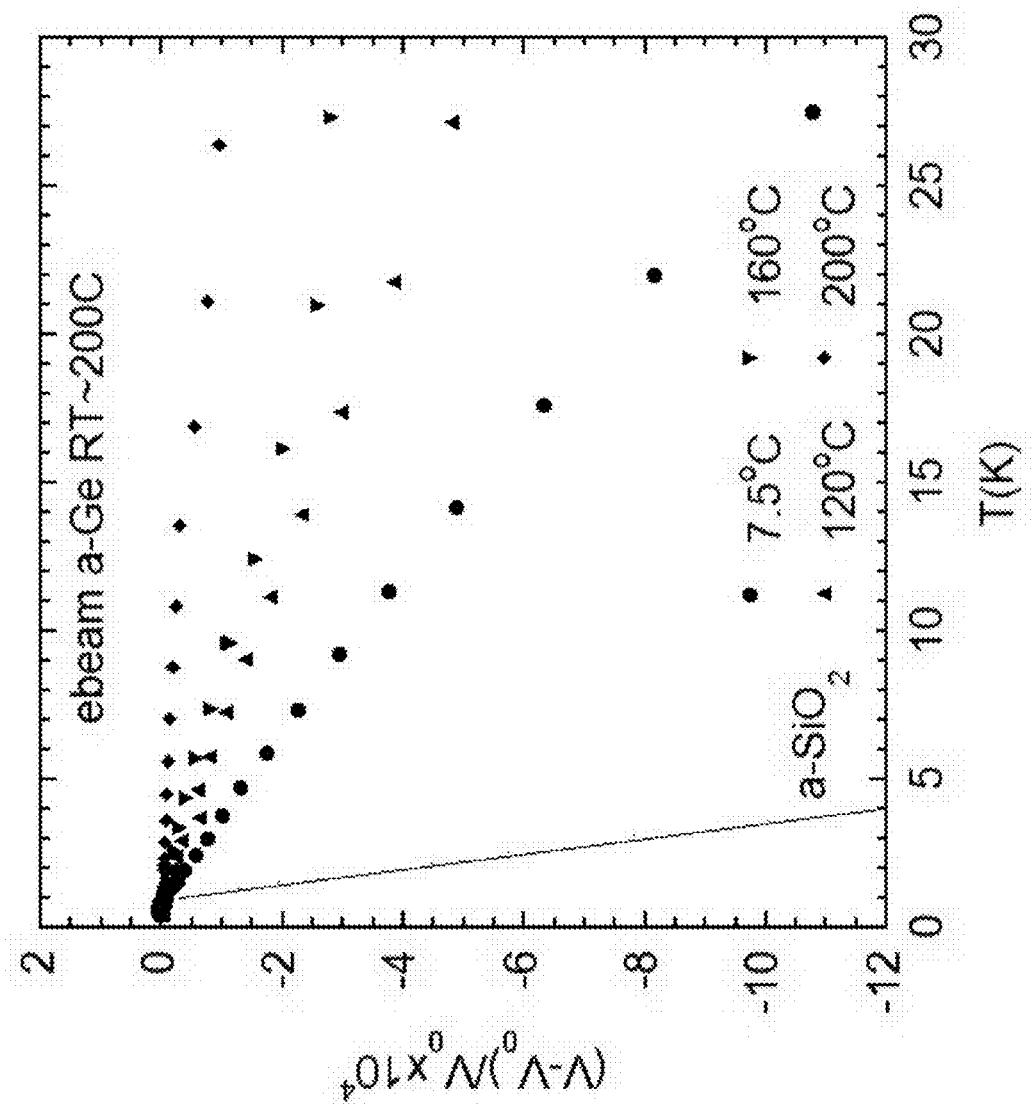
FIG. 9 shows the relative change of speed of sound of the same films shown in FIG. 8 measured at the same time as the internal friction.

FIG. 9 shows the relative change of speed of sound of the same films shown in FIG. 8 measured at the same time with the internal friction. Accompanied with the internal friction plateau, amorphous solids also show a linear T dependent relative change of speed of sound with a negative slope β at a few degree Kelvin. β is proportional to the internal friction plateau. This can be understood as the thermally activated relaxation rate dominates the quantum tunneling rate of the same TLS at higher temperatures. See Rau et al., supra.

The relative change of speed of sound of a-SiO$_2$ is also shown in FIG. 8 as a reference of a typical amorphous solid. As the substrate temperature of a-Ge films increases, β goes almost to zero.

All of these experiments confirm that TLS can be significantly reduced in a-Ge when properly prepared. Similar to a-Si, a-Ge can also be a good candidate to use as a low loss dielectric layer in superconducting quantum bit applications, in particular, when lower substrate temperature is required.

Thus, the present disclosure provides hydrogen-free amorphous dielectric thin Si and Ge films having a near-absence of TLS.

We expect a significant improvement in quantum coherence times by using films prepared in this manner.

In a manner similar to the interaction of TLS with elastic waves which modulates the complex elastic constants such that $\tilde{c}=c_1+ic_2$, where the real part $c_1$ is the elastic constant and the imaginary part $c_2$ is the elastic dissipation (or internal friction), TLS-carrying electric dipoles can also interact with oscillating electric fields and modulate the complex dielectric susceptibility such that $\tilde{\in}=\in_1+i\in_2$, where $\in_1$ is the dielectric susceptibility and $\in_2$ is the dielectric dissipation. The relationship between the elastic/acoustic and dielectric properties (see W. A. Phillips, "Two-level states in glasses," *Rep. Prog. Phys.* 50, 1657 (1987)) suggests that the low TLS contributions to specific heat and internal friction exhibited by a-Si and a-Ge thin films deposited on high-temperature substrates in accordance with the present invention also would mean that the TLS contribution to dielectric loss would also be minimal.

Thus, we expect that the present invention will provide amorphous thin films with the same orders of magnitude reduction of dielectric loss as the elastic loss found in internal friction for use as an insulating dielectric. When prepared by electron beam evaporation of the dielectric material on a high-temperature substrate in a high vacuum and at a low deposition rate, such films have a high density and a low incidence of tunneling states and that are therefore highly suitable for use as an insulating dielectric for superconducting quantum bits.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein. The present application contemplates any and all modifications within the spirit and scope of the underlying invention described and claimed herein, and all such embodiments are within the scope and spirit of the present disclosure.

What is claimed is:

1. A process for making a high-density amorphous germanium dielectric insulating thin film having no two-level tunneling states (TLS) for a superconducting circuit, comprising:
    depositing hydrogen-free amorphous germanium on a substrate having a substrate temperature T$_{sub}$ between about 7.5° and 200° C., the hydrogen-free amorphous germanium being deposited in an ultra-high vacuum system having a base pressure of about 5×10$^{-11}$ Torr and at a deposition vacuum pressure of about 5×10$^{-9}$ Torr, the deposition taking place at a controlled deposition rate of about 0.03 to about 0.05 nm/s;
    wherein the substrate temperature, vacuum pressure, and deposition rate are configured to cause the hydrogen-free amorphous germanium to not become crystalline but to remain in its amorphous state to form a TLS-free amorphous germanium silicon dielectric insulating thin film having a density close to that of its crystalline counterpart.

2. The process according to claim 1, wherein the amorphous germanium is deposited on the substrate by electron beam evaporation, sputtering, chemical vapor deposition, or pulsed laser deposition.

3. A product made by the process of claim 1.

4. A method for making a Josephson junction with a high-density amorphous germanium dielectric insulating thin film having no two-level tunneling states (TLS), comprising:
    depositing a first superconducting material layer on a substrate;
    depositing hydrogen-free amorphous germanium on the first superconducting material layer, the hydrogen-free amorphous germanium being deposited with a substrate temperature between 7.5° and 200° C. under a high vacuum pressure of about 5×10$^{-9}$ Torr and at a controlled deposition rate of about 0.03 to about 0.05 nm/s; and
    depositing a second superconducting material layer on the amorphous germanium dielectric insulating thin film;
    wherein the substrate temperature, vacuum pressure, and deposition rate are configured to cause the hydrogen-free amorphous germanium to not become crystalline but to remain in its amorphous state to form a TLS-free amorphous germanium thin film having a density close to that of its crystalline counterpart;
    wherein the amorphous germanium thin film comprises an insulating dielectric layer separating the first and second superconducting material layers.

5. The process according to claim 4, wherein the hydrogen-free germanium is deposited on the substrate by electron beam evaporation, sputtering, chemical vapor deposition, or pulsed laser deposition.

6. A product made by the process of claim 4.

* * * * *